(12) United States Patent
Lee

(10) Patent No.: US 10,339,996 B2
(45) Date of Patent: Jul. 2, 2019

(54) SEMICONDUCTOR MEMORY DEVICE AND METHOD FOR OPERATING THE SAME

(71) Applicant: SK hynix Inc., Gyeonggi-do (KR)

(72) Inventor: Jung Hwan Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/631,054

(22) Filed: Jun. 23, 2017

(65) Prior Publication Data

US 2018/0158505 A1 Jun. 7, 2018

(30) Foreign Application Priority Data

Dec. 1, 2016 (KR) .......................... 10-2016-0162979

(51) Int. Cl.
| | | |
|---|---|---|
| G11C 11/56 | (2006.01) | |
| G11C 11/4076 | (2006.01) | |
| G11C 7/10 | (2006.01) | |
| G11C 16/28 | (2006.01) | |
| G11C 29/00 | (2006.01) | |
| G11C 16/04 | (2006.01) | |
| H01L 29/10 | (2006.01) | |
| G11C 16/08 | (2006.01) | |
| G11C 16/10 | (2006.01) | |
| G11C 16/16 | (2006.01) | |
| G11C 16/32 | (2006.01) | |

(Continued)

(52) U.S. Cl.
CPC ........ *G11C 11/4076* (2013.01); *G11C 7/1006* (2013.01); *G11C 7/14* (2013.01); *G11C 8/14* (2013.01); *G11C 16/04* (2013.01); *G11C 16/0483* (2013.01); *G11C 16/08* (2013.01); *G11C 16/10* (2013.01); *G11C 16/16* (2013.01); *G11C 16/28* (2013.01); *G11C 16/32* (2013.01); *G11C 16/349* (2013.01); *G11C 29/78* (2013.01); *G11C 29/846* (2013.01); *H01L 29/1062* (2013.01)

(58) Field of Classification Search
CPC ............................ G11C 11/5635; G11C 16/26
USPC ....................................................... 365/185.2
See application file for complete search history.

(56) References Cited

U.S. PATENT DOCUMENTS

| | | | |
|---|---|---|---|
| 9,058,900 B2 * | 6/2015 | Kang | .................. G11C 11/5635 |
| 2014/0126285 A1 * | 5/2014 | Kang | ..................... G11C 16/26 |
| | | | 365/185.2 |

FOREIGN PATENT DOCUMENTS

| | | |
|---|---|---|
| KR | 1020100054468 | 5/2010 |
| KR | 1020110119328 | 11/2011 |

* cited by examiner

Primary Examiner — Jason Lappas
(74) Attorney, Agent, or Firm — IP & T Group LLP

(57) ABSTRACT

Provided herein is a semiconductor memory device and a method for operating the same. The semiconductor memory device may include a memory cell array including a plurality of memory blocks, each including dummy cells coupled to dummy word lines and normal memory cells coupled to normal word lines, a peripheral circuit configured to perform an erase operation on a memory block selected from among the plurality of memory blocks and control logic configured to control the peripheral circuit, during the erase operation, to apply a pre-program voltage pulse to the dummy word lines and the normal word lines, and to control application of dummy word line voltages to the dummy word lines based on Erase-Write (EW) cycling information while applying an erase voltage to a common source line of the selected memory block, wherein the EW cycling information indicates a number of erase-write cycles of the selected memory block.

15 Claims, 11 Drawing Sheets

(51) Int. Cl.
  *G11C 16/34* (2006.01)
  *G11C 7/14* (2006.01)
  *G11C 8/14* (2006.01)

SEMICONDUCTOR MEMORY DEVICE AND METHOD FOR OPERATING THE SAME

CROSS-REFERENCE TO RELATED APPLICATION

The present application claims priority under 35 U.S.C. § 119(a) to Korean patent application number 10-2016-0162979 filed on Dec. 1, 2016, the entire disclosure of which is herein incorporated by reference.

BACKGROUND

Field of Invention

Various embodiments of the present disclosure generally relate to an electronic device, and more particularly, to a semiconductor memory device and a method of operating the semiconductor memory device.

Description of Related Art

Semiconductor memory devices are memory devices realized using a semiconductor such as silicon (Si), germanium (Ge), gallium arsenide (GaAs), or indium phosphide (InP). Semiconductor memory devices are classified into a volatile memory device and a nonvolatile memory device.

The volatile memory device is a memory device in which data stored therein is lost when power is turned off. Representative examples of the volatile memory device include a static RAM (SRAM), a dynamic RAM (DRAM), and a synchronous DRAM (SDRAM). The nonvolatile memory device is a memory device in which data stored therein is retained even when power is turned off. Representative examples of the nonvolatile memory device include a read-only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM). The flash memory is classified into a NOR type memory and a NAND type memory.

SUMMARY

Various embodiments of the present disclosure are directed to a semiconductor memory device having improved reliability and a method for operating the semiconductor memory device.

An embodiment of the present disclosure may provide for a semiconductor memory device. The semiconductor memory device may include a memory cell array including a plurality of memory blocks, each including dummy cells coupled to dummy word lines and normal memory cells coupled to normal word lines, a peripheral circuit configured to perform an erase operation on a memory block selected from among the plurality of memory blocks and control logic configured to control the peripheral circuit, during the erase operation, to apply a pre-program voltage pulse to the dummy word lines and the normal word lines, and to control application of dummy word line voltages to the dummy word lines based on Erase-Write (EW) cycling information while applying an erase voltage to a common source line of the selected memory block, wherein the EW cycling information indicates a number of erase-write cycles of the selected memory block.

An embodiment of the present disclosure may provide a method for operating a semiconductor memory device. The semiconductor memory device may include a plurality of memory blocks, each including dummy cells coupled to dummy word lines and normal memory cells coupled to normal word lines. The method may include applying a pre-program voltage pulse to dummy word lines and to normal word lines that are coupled to a memory block selected from among the plurality of memory blocks and controlling application of dummy word line voltages to the dummy word lines based on Erase-Write (EW) cycling information while applying an erase voltage to a common source line of the selected memory block, wherein the EW cycling information indicates a number of erase-write cycles of the selected memory block.

DETAILED DESCRIPTION

Figure 1:
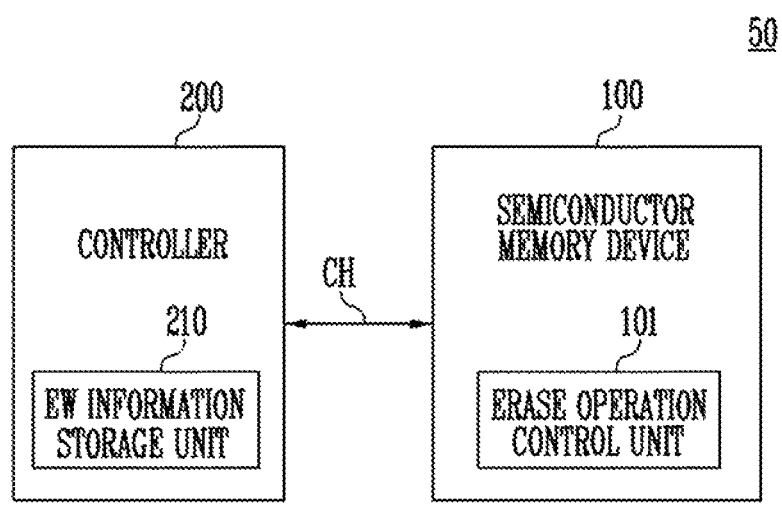
FIG. 1 is a block diagram for explaining a memory system including a semiconductor memory device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is to referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments and intermediate structures. As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural form as long as it is not specifically mentioned in a sentence. Moreover, "include/comprise" or "including/comprising" used in the specification represents that one or more components, steps, operations, and elements exist or are added.

Furthermore, unless defined otherwise, all the terms used In this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. Alternatively, "directly connected/directly coupled" refers to one component directly coupling another component without an intermediate component.

FIG. 1 is a block diagram for explaining a semiconductor memory device according to an embodiment of the present disclosure.

Referring to FIG. 1, a memory system 50 may include a semiconductor memory device 100 and a controller 200.

The semiconductor memory device 100 may take many alternative forms, such as a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In addition, the semiconductor memory device 100 according to the present disclosure may be implemented as a three-dimensional array structure. The present disclosure may also be applied not only to a flash memory in which a charge storage layer is implemented as a conductive floating gate (FG), but also to a charge trap flash (CTF) memory in which a charge storage layer is implemented as an insulating layer.

The semiconductor memory device 100 is operated under the control of the controller 200. The semiconductor memory device 100 includes a memory cell array having a plurality of memory blocks. In an embodiment, the semiconductor memory device 100 may be a flash memory device.

The semiconductor memory device 100 is configured to receive a command and an address from the controller 200 through a channel CH and to access an area selected by the address from the memory cell array. That is, the semiconductor memory device 100 performs an internal operation corresponding to the command on the area selected by the address.

For example, the semiconductor memory device 100 may perform a program operation, a read operation, and an erase operation. During a program operation, the semiconductor memory device 10 may program data into the area selected by the address. During a read operation, the semiconductor memory device 100 may read data from the area selected by the address. During an erase operation, the semiconductor memory device 100 may erase data stored in the area selected by the address.

The controller 200 may control the semiconductor memory device 100 so that a program operation, a read operation or an erase operation is performed. During a program operation, the controller 200 may provide a program command, an address, and data to the semiconductor memory device 100 through the channel CH. During a read operation, the controller 200 may provide a read command and an address to the semiconductor memory device 100 through the channel CH. During an erase operation, the controller 200 may provide an erase command and an address to the semiconductor memory device 100 through the channel CH.

The controller 200 may include an Erase-Write (EW) information storage unit 210. The controller 200 may store Erase-Write (EW) cycling information in the EW information storage unit 210, wherein the EW cycling information indicates the number of times that data is erased from memory cells included in the semiconductor memory device 100 and the number of times that data is written to the memory cells that is, the number of erase-write cycles. In an embodiment, the controller 200 may store EW cycling information of the memory cells included in the semiconductor memory device 100 in the EW information storage unit 210 for respective memory blocks while performing the program operation or the erase operation of the semiconductor memory device 100.

The controller 200 may provide the EW cycling information to the semiconductor memory device 100 either periodically or at a random time. For example, the controller 200 may provide the EW cycling information, stored in the EW information storage unit 210, to the semiconductor memory device 100 when the EW cycling information of the memory cells included in the semiconductor memory device 100 reaches the preset number of erase-write cycles.

In an embodiment, the controller 200 may provide the EW cycling information to the semiconductor memory device 100 through a parameter setting command (set parameter command) or a feature setting command (set feature command). The set parameter command or the set feature command may be a command for changing values of an internal register included in the semiconductor memory device 100.

The controller 200 may provide the EW cycling information to the semiconductor memory device 100 through the set parameter command. For example, the controller 200 may transmit the set parameter command, the address of an internal register, and parameter values to the semiconductor memory device 100. The semiconductor memory device 100 may change the values of the internal register according to the parameter values provided by the controller 200 in response to the provided set parameter command. The EW cycling information may be provided as the parameter values.

Alternatively, the controller 200 may provide the EW cycling information to the semiconductor memory device 100 through the set feature command. For example, the controller 200 may transmit the set feature command, a feature address, and feature values to the semiconductor memory device 100. The semiconductor memory device 100 may change the values of the internal register according to the feature values provided by the controller 200 in response to the provided set feature command. The EW cycling information may be provided as the feature values.

In accordance with the embodiment of the present disclosure, the semiconductor memory device 100 may include an erase operation control unit 101.

The semiconductor memory device 100 may erase data stored in the memory cells included in the semiconductor memory device 100 depending on the operation of the erase operation control unit 101. An erase operation of erasing the data stored in the memory cells may be performed on a memory block basis.

The erase operation control unit 101 may include an internal register for storing the EW cycling information provided from the controller 200.

For example, during the erase operation, the semiconductor memory device 100 may receive the erase command and the address of a memory block, from which data is to be erased, from the controller 200. The semiconductor memory device 100 may select the memory block corresponding to the provided address and may perform an erase operation for erasing data from the selected memory block.

The erase operation control unit 101 may control the levels of voltages to be applied to the memory cells of the semiconductor memory device 100, may control the times at which the voltages are to be applied, etc. while the erase operation is performed. For example, information about the levels of the voltages to be applied to the memory cells, the times at which the voltages are to be applied, etc. while the erase operation is performed may be stored in advance in the semiconductor memory device 100. In an embodiment, the erase operation control unit 101 includes the internal register for storing the EW cycling information.

In accordance with an embodiment of the present disclosure, the erase operation control unit 101 may apply an erase prohibition voltage to dummy word lines coupled to dummy cells included in a selected memory block while an erase voltage is applied to the selected memory block.

The erase operation control unit 101 may determine the time at which the erase prohibition voltage is to be applied to the dummy cells, based on the EW cycling information stored in the internal register. The erase operation control unit 101 may apply the erase prohibition voltage to dummy word lines coupled to the dummy cells included in the selected memory block at the time determined based on the EW cycling information while the erase voltage is applied to the selected memory block. In an embodiment, the erase operation control unit 101 may apply the erase prohibition voltage to dummy cells included in a memory block having greater erase-write cycles prior to applying the erase prohibition voltage to dummy cells included in other memory blocks.

An erase method according to an embodiment of the present disclosure will be described in detail later with reference to FIGS. 6 to 9.

Although not illustrated in the drawings, the controller 200 may include components, such as a Random Access Memory (RAM), a processing unit, a host interface, and a memory interface, in an embodiment.

The RAM is used as at least one of a work memory of the processing unit, a cache memory between the semiconductor memory device 100 and the host, and a buffer memory between the semiconductor memory device 100 and the host.

The processing unit controls the overall operation of the controller 200. The processing unit is configured to control a read operation, a program operation, an erase operation, and a background operation of the semiconductor memory device 100. The processing unit is configured to run firmware for controlling the semiconductor memory device 100. In an embodiment, the processing unit may perform a function of a flash translation layer (FTL). The processing unit may translate a logical block address (LBA), provided by the host, into a physical block address (PBA) through the FTL. The FTL may receive the LBA using a mapping table and may translate the LBA into the PBA. Address mapping methods performed through the FTL include various methods according to a mapping unit. Representative address mapping methods include a page mapping method, a block mapping method, and a hybrid mapping method.

The processing unit is configured to randomize data provided from the host. For example, the processing unit may randomize the data provided from the host using a randomizing seed. The randomized data is provided, as data to be stored, to the semiconductor memory device and is then programmed in the memory cell array.

The processing unit is configured to derandomize the data provided from the semiconductor memory device 100 during a read operation. For example, the processing unit may derandomize the data provided from the semiconductor memory device 100 using a derandomizing seed. The derandomized data may be outputted to the host. In an embodiment, the processing unit may perform randomizing and derandomizing operations by running software or firmware.

The host interface may include a protocol for performing data exchange between the host and the controller 200. In an embodiment, the controller 200 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface interfaces with the semiconductor memory device 100. For example, the memory interface includes a NAND interface or a NOR interface.

Figure 2:
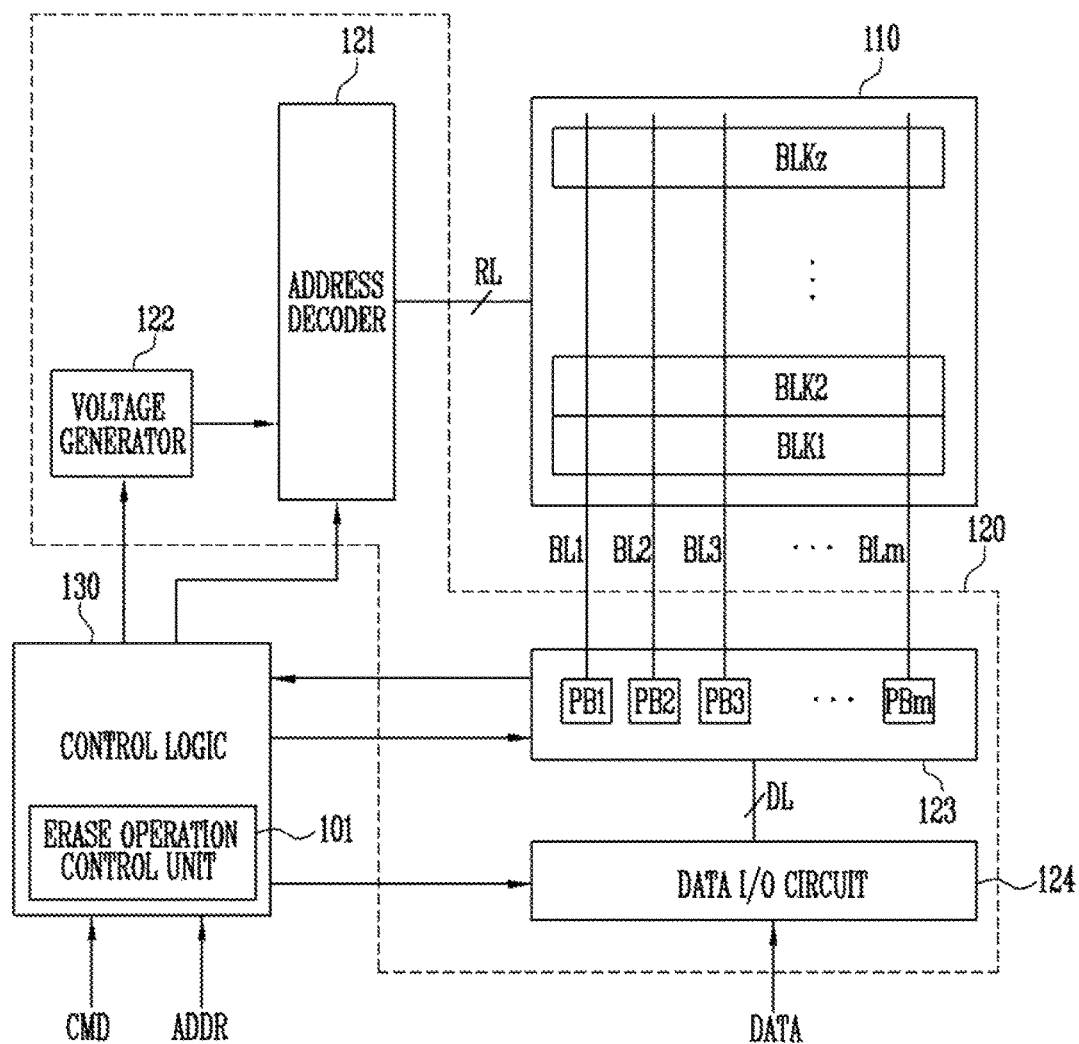
FIG. 2 is a block diagram illustrating the configuration of the semiconductor memory device of FIG. 1.

FIG. 2 is a block diagram illustrating the configuration of the semiconductor memory device 100 of FIG. 1.

Referring to FIG. 2, the semiconductor memory device 100 may include a memory cell array 110, a peripheral circuit 120, and control logic 130.

The memory cell array 110 includes a plurality of memory blocks BLK1 to BLKz. The plurality of memory blocks BLK1 to BLKz are coupled to an address decoder 121 through row lines RL. The memory blocks BLK1 to BLKz are coupled to a read and write circuit 123 through bit lines BL1 to BLm. Each of the memory blocks BLK1 to BLKz includes a plurality of memory cells. In an embodiment, the plurality of memory cells are nonvolatile memory cells. In the plurality of memory cells, memory cells coupled to the same word line are defined as a single page. That is, the memory cell array 110 is composed of a plurality of pages. In an embodiment, each of the plurality of memory blocks BLK1 to BLKz included in the memory cell array 110 may include a plurality of dummy cells. As the dummy cells, one or more dummy cells may be connected in series between a drain select transistor and the memory cells and between a source select transistor and the memory cells.

The memory cells of the semiconductor memory device 100 may be each implemented as a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include the address decoder 121, a voltage generator 122, the read and write circuit 123, and a data input/output (I/O) circuit 124.

The peripheral circuit 120 may drive the memory cell array 110. For example, the peripheral circuit 120 may drive the memory cell array 110 so that a program operation, a read operation, and an erase operation are performed.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 is configured to be operated under the control of the control logic 130. The address decoder 121 receives an address ADDR from the control logic 130.

The address decoder 121 is configured to decode a block address of the provided address ADDR. The address decoder 121 selects at least one memory block from among the memory blocks BLK1 to BLKz in response to the decoded block address. The address decoder 121 is configured to decode a row address of the provided address ADDR. The address decoder 121 may select at least one word line of the selected memory block by applying voltages supplied from the voltage generator 122 to at least one word line WL in response to the decoded row address.

During a program operation, the address decoder 121 may apply a program voltage to the selected word line and apply a pass voltage having a level lower than that of the program voltage to unselected word lines. During a program verify operation, the address decoder 121 may apply a verification voltage to a selected word line and apply a verification pass voltage higher than the verification voltage to unselected word lines.

During a read operation, the address decoder 121 may apply a read voltage to a selected word line and apply a pass voltage higher than the read voltage to unselected word lines.

In an embodiment, an erase operation of the semiconductor memory device 100 is performed on a memory block basis. During an erase operation, the address ADDR inputted to the semiconductor memory device 100 includes a block address. The address decoder 121 may decode the block address and select a single memory block in response to the decoded block address. During an erase operation, the address decoder 121 may apply a ground voltage to word lines coupled to the selected memory block.

In an embodiment, the address decoder 121 may be configured to decode a column address of the provided address ADDR. A decoded column address DCA may be transferred to the read and write circuit 123. In an exemplary embodiment, the address decoder 121 may include components such as a row decoder, a column decoder, and an address buffer.

The voltage generator 122 is configured to generate a plurality of voltages using an external supply voltage provided to the semiconductor memory device 100. The voltage generator 122 is operated under the control of the control logic 130.

In an embodiment, the voltage generator 122 may generate an internal supply voltage by regulating the external supply voltage. The internal supply voltage generated by the voltage generator 122 is used as an operating voltage of the semiconductor memory device 100.

In an embodiment, the voltage generator 122 may generate a plurality of voltages using an external supply voltage or an internal supply voltage. The voltage generator 122 may be configured to generate various voltages required by the semiconductor memory device 100. For example, the voltage generator 122 may generate a plurality of program voltages, a plurality of pass voltages, a plurality of select read voltages, and a plurality of unselect read voltages.

For example, the voltage generator 122 may include a plurality of pumping capacitors for receiving the internal supply voltage and may generate a plurality of voltages by selectively activating the pumping capacitors under the control of the control logic 130.

The generated voltages may be supplied to the memory cell array 110 by the address decoder 121.

The read and write circuit 123 includes first to m-th pages buffers PB1 to PBm. The first to m-th page buffers PB1 to PBm are coupled to the memory cell array 100 through the first to m-th bit lines BL1 to BLm, respectively. The first to m-th page buffers PB1 to PBm are operated under the control of the control logic 130.

The first to m-th page buffers PB1 to PBm perform data communication with the data I/O circuit 124. During a program operation, the first to m-th page buffers PB1 to PBm receive data DATA to be stored through the data I/O circuit 124 and data lines DL.

During a program operation, the first to m-th page buffers PB1 to PBm may transfer the data DATA, provided through the data I/O circuit 124, to selected memory cells through the bit lines BL1 to BLm when a program pulse is applied to each selected word line. The memory cells in the selected page are programmed based on the transferred data DATA. Memory cells coupled to a bit line to which a program permission voltage for example, a ground voltage is applied may have increased threshold voltages. Threshold voltages of memory cells coupled to a bit line to which a program prohibition voltage for example, a supply voltage is applied may be maintained. During a program verify operation, the first to m-th page buffers read page data from the selected memory cells through the bit lines BL1 to BLm.

During a read operation, the read and write circuit 123 reads data DATA from the memory cells in the selected page through the bit lines BL, and outputs the read data DATA to the data I/O circuit 124.

During an erase operation, the read and write circuit 123 may float the bit lines BL. In an embodiment, the read and write circuit 123 may include a column select circuit.

The data I/O circuit 124 is coupled to the first to m-th page buffers PB1 to PBm through the data lines DL. The data I/O circuit 124 is operated under the control of the control logic 130.

The data input/output (I/O) circuit 124 may include a plurality of I/O buffers (not illustrated) for receiving inputted data. During a program operation, the data I/O circuit 124 receives data DATA to be stored from an external controller (not illustrated). During a read operation, the data I/O circuit 124 outputs the data, provided from the first to m-th page buffers PB1 to PBm included in the read and write circuit 123, to the external controller.

The control logic 130 may be coupled to the address decoder 121, the voltage generator 122, the read and write circuit 123, and the data I/O circuit 124. The control logic 130 may be configured to control the overall operation of the semiconductor memory device 100. The control logic 130 may be operated in response to a command CMD provided from an external device.

In an embodiment, the control logic 130 may receive EW cycling information of the memory blocks BLK1 to BLKz included in the memory cell array 110 from the external controller.

The control logic 130 may receive the EW cycling information from the external controller in response to the set parameter command or the set feature command. In an embodiment, the set parameter command or the set feature command may be a command for changing the values of an internal register included in the semiconductor memory device 100. In an embodiment, the internal register for storing the EW cycling information may be included in an erase operation control unit 101.

The control logic 130 may receive the EW cycling information in response to the set parameter command. The control logic 130 may receive the set parameter command, the address of an internal register, and parameter values from the external controller. The control logic 130 may change the values of the internal register according to the provided parameter values in response to the provided set parameter command. The parameter values may include EW cycling information.

In an embodiment, the control logic 130 may receive the EW cycling information in response to the set feature command. The control logic 130 may receive the set feature command, a feature address, and feature values from the external controller. The control logic 130 may change the values of the internal register according to the provided feature values in response to the provided set feature command. The feature values may include EW cycling information.

After performing a pre-program operation to memory cells included in a selected memory block during an erase operation, the control logic 130 may apply an erase voltage to the selected memory block. Furthermore, while the erase voltage is applied, the control logic 130 may control the threshold voltages of dummy cells by applying an erase prohibition voltage to the dummy word lines at a certain time after a ground voltage is applied to the dummy word lines.

The control circuit 130 may further include the erase operation control unit 101. The erase operation control unit 101 may control an erase operation to a memory block selected from among the plurality of memory blocks BLK1 to BLKz included in the memory cell array 110.

The erase operation control unit 101 may control voltages applied to row lines or bit lines that are coupled to the selected memory block during the erase operation.

In accordance with an embodiment of the present disclosure, the erase operation control unit 101 performs a pre-program operation. The erase operation control unit 101 may apply a pre-program voltage pulse to word lines coupled to the selected memory block. In an embodiment, the word lines may include normal word lines and dummy word lines.

In an embodiment, after performing the pre-program operation, the erase operation control unit 101 may apply an erase voltage to the selected memory block. The erase operation control unit 101 may control the peripheral circuit 120 to apply an erase voltage Verase to a common source line during an erase operation. The erase operation control unit 101 may control the peripheral circuit 120 to apply an erase permission voltage for example, a ground voltage to normal word lines and dummy word lines, which are coupled to the selected memory block. When the ground voltage is applied to the word lines, data in the memory cells and the dummy cells may be erased. That is, the threshold voltages of the memory cells and the dummy cells may be decreased until they reach a threshold voltage corresponding to an erase state (E).

The erase operation control unit 101 may control a degree at which dummy memory cells are erased while the erase voltage Verase is applied to the common source line. For example, during a middle of an increase of the voltage of the common source line, the erase operation control unit 101 may apply an erase prohibition voltage Verase_pass to the dummy word lines. That is, if the erase prohibition voltage Verase_pass is applied to the dummy word lines after a certain time since the application of the erase permission voltage, the threshold voltages of the dummy cells may not be further decreased.

The erase operation control unit 101 may determine the time at which the erase prohibition voltage is to be applied to the dummy cells, based on the EW cycling information stored in the internal register. The erase operation control unit 101 may apply the erase prohibition voltage to the dummy word lines coupled to the dummy cells included in the selected memory block at the time determined based on the EW cycling information while the erase voltage is applied to the selected memory block. In an embodiment, the erase operation control unit 101 may apply the erase prohibition voltage to dummy cells included in a memory block having greater erase-write cycles prior to applying the erase prohibition voltage to dummy cells included in other memory blocks.

Figure 3:
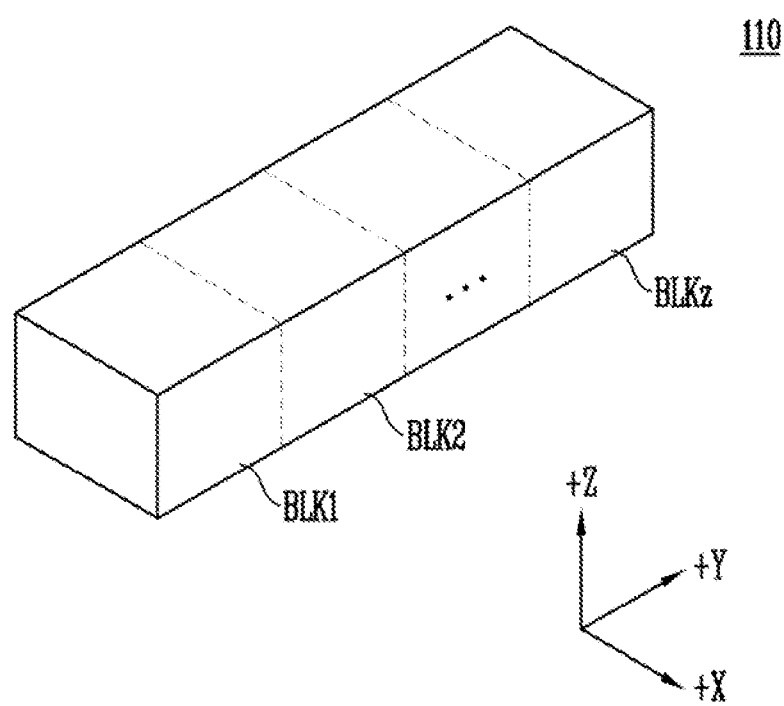
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block has a 3D structure. Each memory block includes a plurality of memory cells stacked on a substrate. Such memory cells are arranged along a positive X (+X) direction, a positive Y (+Y) direction, and a positive Z (+Z) direction. The structure of each memory block will be described below with reference to FIG. 4.

Figure 4:
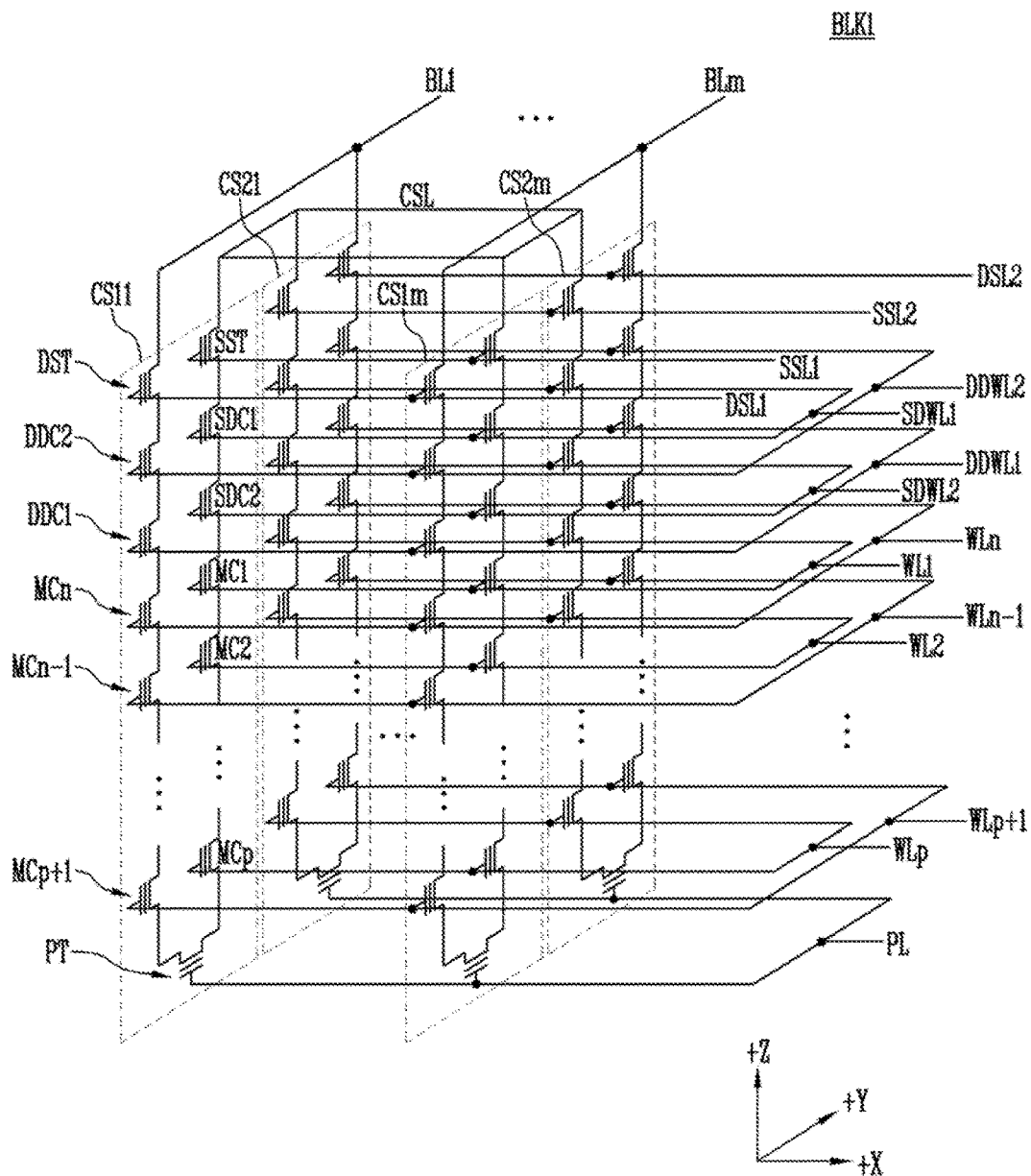
FIG. 4 is a circuit diagram illustrating any one of memory blocks of FIG. 3.

FIG. 4 is a circuit diagram illustrating any one (BLK1) of the memory blocks BLK1 to BLKz of FIG. 3.

Referring to FIG. 4, the first memory block BLK1 includes a plurality of cell strings CS11 to CS1$m$ and CS21 to CS2$m$. In an embodiment, each of the cell strings CS11 to CS1$m$ and CS21 to CS2$m$ may be formed in a 'U' shape. In the first memory block BLK1, m cell strings are arranged in a row direction that is, +X direction. Referring to FIG. 4, two cell strings are illustrated as being arranged in a column direction that is, +Y direction. However, this illustration is made for convenience of description, and it will be understood that three or more cell strings may be arranged in the column direction.

Each of the plurality of cell strings CS11 to CS1$m$ and CS21 to CS2$m$ includes at least one source select transistor SST, one or more source-side dummy memory cells SDC1 and SDC2, first to n-th normal memory cells MC1 to MCn, a pipe transistor PT, one or more drain-side dummy memory cells DDC1 and DDC2, and at least one drain select transistor DST.

The select transistors SST and DST, the dummy memory cells SDC1, SDC2, DDC1, and DDC2, and the normal memory cells MC1 to MCn may have similar structures, respectively. In an embodiment, each of the select transistors SST and DST, the dummy memory cells SDC1, SDC2, DDC1, and DDC2, and the normal memory cells MC1 to MCn may include a channel layer, a tunneling insulating layer, a charge storage layer, and a blocking insulating layer.

The source select transistor SST in each cell string is coupled between a common source line CSL and the source-side dummy memory cells SDC1 and SDC2.

In an embodiment, the source select transistors of cell strings arranged in the same row are coupled to a source select line extended in a row direction. The source select transistors of cell strings arranged in different rows are coupled to different source select lines. Referring to FIG. 4, the source select transistors of the cell strings CS11 to CS1$m$ in a first row are coupled to a first source select line SSL1. The source select transistors of the cell strings CS21 to CS2$m$ in a second row are coupled to a second source select line SSL2.

In each cell string, two source-side dummy memory cells SDC1 and SDC2 may be provided. However, this is only an example, and it will be understood that three or more source-side dummy memory cells may be provided in each cell string. The source-side dummy memory cells SDC1 and SDC2 in each cell string are connected in series between the source select transistor SST and the normal memory cells MC1 to MCp. The gate of the first source-side dummy memory cell SDC1 in each cell string is coupled to a first source-side dummy word line SDWL1. The gate of the second source-side dummy memory cell SDC2 is coupled to a second source-side dummy word line SDWL2.

The first to n-th normal memory cells MC1 to MCn in each cell string are coupled between the source-side dummy memory cells SDC1 and SDC2 and the drain-side dummy memory cells DDC1 and DDC2.

The first to n-th normal memory cells MC1 to MCn may be divided into first to p-th normal memory cells MC1 to MCp and p+1-th to n-th normal memory cells MCp+1 to MCn. The first to p-th normal memory cells MC1 to MCp are sequentially arranged in a direction opposite a positive (+) Z direction and are connected in series between the source-side dummy memory cells SDC1 and SDC2 and the pipe transistor PT. The p+1-th to n-th normal memory cells MCp+1 to MCn are sequentially arranged in the +Z direction and are connected in series between the pipe transistor PT and the drain-side dummy memory cells DDC1 and DDC2. The first to p-th normal memory cells MC1 to MCp and the p+1-th to n-th normal memory cells MCp+1 to MCn are coupled to each other through the pipe transistor PT. The gates of the first to n-th normal memory cells MC1 to MCn in each cell string are coupled to first to n-th normal word lines WL1 to WLn, respectively.

Data may be stored in the first to n-th normal memory cells MC1 to MCn through first to m-th bit lines BL1 to BLm. The data stored in the first to n-th normal memory cells MC1 to MCn may be read through the first to m-th bit lines BL1 to BLm.

The gate of the pipe transistor PT in each cell string is coupled to a pipeline PL.

In each cell string, two drain-side dummy memory cells DDC1 and DDC2 are provided. However, this is only an example, and it will be understood that three or more drain-side dummy memory cells may be provided in each cell string. The drain-side dummy memory cells DDC1 and DDC2 in each cell string are connected in series between the drain select transistor DST and the normal memory cells MCp+1 to MCn. The gate of the first drain-side dummy memory cell DDC1 in each cell string is coupled to a first drain-side dummy word line DDWL1. The gate of the second drain-side dummy memory cell DDC2 in each cell string is coupled to a second drain-side dummy word line DDWL2.

The drain select transistor DST in each cell string is coupled between the corresponding bit line and the drain-side dummy memory cells DDC1 and DDC2. The cell strings arranged in a row direction are coupled to drain select lines extended in the row direction. The drain select transistors of the cell strings CS11 to CS1$m$ in a first row are coupled to a first drain select line DSL1. The drain select transistors of the cell strings CS21 to CS2$m$ in a second row are coupled to a second drain select line DSL2.

Cell strings arranged in a column direction are coupled to bit lines extended in the column direction. Referring to FIG. 4, the cell strings CS11 and CS21 in a first column are coupled to a first bit line BL1. The cell strings CS1$m$ and CS2$m$ In an m-th column are coupled to an m-th bit line BLm.

In an embodiment, instead of the first to m-th bit lines BL1 to BLm, even bit lines and odd bit lines may be provided. Further, among the cell strings CS11 to CS1$m$ or CS21 to CS2$m$ arranged in a row direction, even-numbered cell strings may be coupled to the even bit lines, respectively. Among the cell strings CS11 to CS1$m$ or CS21 to CS2$m$ arranged in a row direction, odd-numbered cell strings may be coupled to the odd bit lines, respectively.

The dummy memory cells SDC1, SDC2, DDC1, and DDC2 are provided to stably control the voltage or current of the corresponding cell string. For example, the source-side dummy memory cells SDC1 and SDC2 are provided to reduce an electric field between the source select transistor SST and the normal memory cells MC1 to MCp. For example, the drain-side dummy memory cells DDC1 and DDC2 are provided to reduce an electric field between the drain select transistor DST and the normal memory cells MCp+1 to MCn. As more dummy memory cells are provided, the reliability of the operation of the memory block BLK1 is improved, but the size of the memory block BLK1 is increased. As fewer memory cells are provided, the size of the memory block BLK1 is reduced, but the reliability of the operation of the memory block BLK1 is to deteriorated.

In order to efficiently control the dummy memory cells SDC1, SDC2, DDC1, and DDC2, the dummy memory cells SDC1, SDC2, DDC1, and DDC2 are required to have desired threshold voltages. Before an erase operation on the memory block BLK1 is performed, pre-program operations may be performed on all or some of the dummy memory cells SDC1, SDC2, DDC1, and DDC2. When the erase operation is performed after the pre-program operations have been performed, the dummy memory cells SDC1, SDC2, DDC1, and DDC2 may have desired threshold voltages by controlling voltages that are applied to the dummy word lines SDWL1, SDWL2, DDWL1, and DDWL2 coupled to respective dummy memory cells SDC1, SDC2, DDC1, and DDC2.

Figure 5:
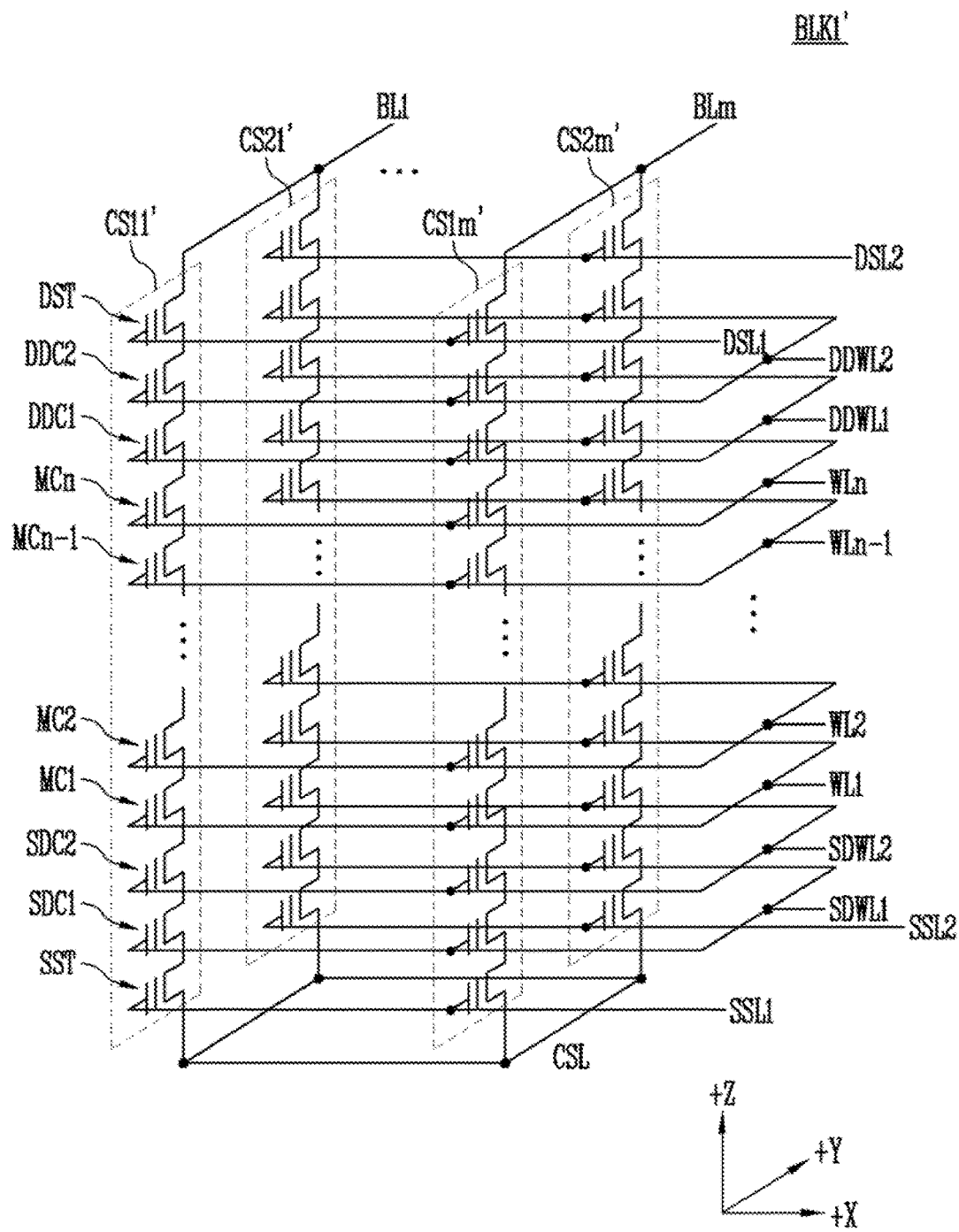
FIG. 5 is a circuit diagram illustrating other embodiments of any one of the memory blocks of FIG. 3.

FIG. 5 is a circuit diagram illustrating other embodiments (BLK1') of any one (BLK1) of the memory blocks BLK1 to BLKz illustrated in FIG. 3.

Referring to FIG. 5, the first memory block BLK1' includes a plurality of cell strings CS11' to CS1$m$' and CS21' to CS2$m$. The plurality of cell strings CS11' to CS1$m$' and CS21' to CS2$m$' are extended along a positive Z (+Z) direction. Each of the cell strings CS11' to CS1$m$' and CS21' to CS2$m$' includes at least one source select transistor SST, one or more source-side dummy memory cells SDC1 and SDC2, first to n-th normal memory cells MC1 to MCn, one or more drain-side dummy memory cells DDC1 and DDC2, and at least one drain select transistor DST, which are stacked on a substrate (not illustrated) below the memory block BLK1'.

The source select transistor SST in each cell string is coupled between a common source line CSL and the source-side dummy memory cells SDC1 and SDC2. The source select transistors of cell strings for example, CS11' to CS1$m$' arranged in the same row are coupled to the same source select line for example, SSL1. The source select transistors of the cell strings CS11' to CS1$m$' arranged in a first row are coupled to a first source select line SSL1. The source select transistors of the cell strings CS21' to CS2$m$' arranged in a second row are coupled to a second source select line SSL2.

The source-side dummy memory cells SDC1 and SDC2 in each cell string are connected in series between the source select transistor SST and the normal memory cells MC1 to MCn. The source-side dummy memory cells arranged at the same height are coupled to the same source-side dummy word line. The gates of the first and second source-side dummy memory cells SDC1 and SDC2 are coupled to first and second source-side dummy word lines SDWL1 and SDWL2, respectively.

The first to n-th normal memory cells MC1 to MCn in each cell string are connected in series between the source-side dummy memory cells SDC1 and SDC2 and the drain-side dummy memory cells DDC1 and DDC2. The gates of the first to n-th normal memory cells MC1 to MCn are coupled to first to n-th normal word lines WL1 to WLn, respectively.

The drain-side dummy memory cells DDC1 and DDC2 in each cell string are connected in series between the drain select transistor DST and the normal memory cells MC1 to MCn. The drain-side dummy memory cells arranged at the same height are coupled to the same drain-side dummy word line. The first and second drain-side dummy memory cells DDC1 and DDC2 are coupled to first and second drain-side dummy word lines DDWL1 and DDWL2, respectively.

The drain select transistor DST in each cell string is coupled between the corresponding bit line and the drain-side dummy memory cells DDC1 and DDC2. The drain select transistors of cell strings arranged in a row direction are coupled to drain select lines extended in the row direction. The drain select transistors of the cell strings CS11' to CS1$m$' in a first row are coupled to a first drain select line DSL1. The drain select transistors of the cell strings CS21' to CS2$m$' in a second row are coupled to a second drain select line DSL2.

As a result, the memory block BLK1' of FIG. 5 has an equivalent circuit similar to that of the memory block BLK1 of FIG. 4 except that a pipe transistor PT is excluded from each cell string.

Hereinafter, embodiments of the present disclosure will be described based on the memory block BLK1 of FIG. 4 for the convenience of description.

Figure 6:
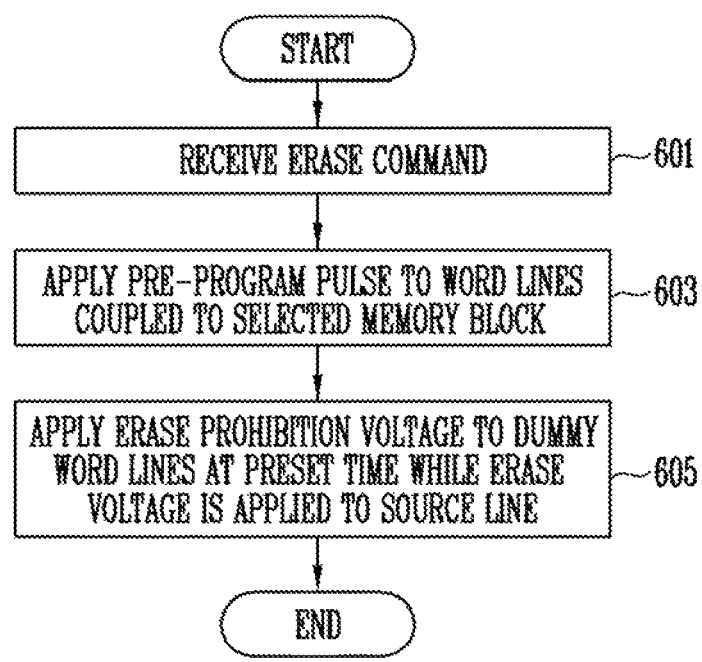
FIG. 6 is a flowchart for explaining an erase operation of a semiconductor memory device according to an embodiment of the present disclosure.

FIG. 6 is a flowchart for explaining an erase operation of a semiconductor memory device according to an embodiment of the present disclosure.

Referring to FIG. 6, at step 601, the semiconductor memory device may receive an erase command. The semiconductor memory device may receive the address of a memory block to be erased together with the erase command.

At step 603, the semiconductor memory device may perform a pre-program operation to a selected memory block. For this operation, the semiconductor memory device may apply a pre-program pulse to word lines coupled to the selected memory block. In an embodiment, the word lines may include normal word lines and dummy word lines. In an embodiment, the semiconductor memory device may not perform a verify operation during the pre-program operation. In an embodiment, the pre-program pulse applied during the pre-program operation may have a voltage level such that the dummy cells have target threshold voltages after the application of an erase voltage.

At step 605, while the erase voltage is applied to a source line, the semiconductor memory device may apply an erase prohibition voltage to the dummy word lines at a preset time. In detail, the semiconductor memory device applies the erase voltage Verase to a common source line CSL. In an embodiment, the semiconductor memory device may apply the erase voltage Verase to a node MTSRC coupled to the common source line CSL. Furthermore, a source select transistor SST and a drain select transistor DST may be controlled to be in a floating state. The semiconductor memory device may apply an erase permission voltage for example, a ground voltage to the normal word lines and the dummy word lines which are coupled to the selected memory block. Thereafter, the potential levels of channels may be increased depending on the potential level of the common source line CSL. Depending on the potential levels of the channels, the potential levels of source select lines and drain select lines, which are coupled to a plurality of source select transistors and drain select transistors that are in a floating state, may be increased due to a coupling phenomenon.

Pieces of data stored in the memory cells are erased due to the increased potential levels of the channels. That is, electrons stored in the charge storage layers of the memory cells are detrapped by the potentials of the channels due to FN tunneling. This operation will be described below. Depending on differences between the increased potential levels of the channels and the potential levels of local word lines having a ground level, the electrons stored in the charge storage layers of the memory cells may be emitted through the channels and detrapped or, alternatively, hot holes generated in the channels may flow into the charge storage layers of the memory cells and then the electrons stored in the charge storage layers are detrapped. The local word lines may be maintained at the ground level or may be changed from the floating state to the ground level.

The semiconductor memory device may control a degree at which the dummy memory cells are erased while the erase voltage Verase is applied to the common source line CSL. For example, if the preset time has elapsed while the voltage of the common source line CSL is increased, the semiconductor memory device may apply an erase prohibition voltage Verase_pass to the dummy word lines. That is, if the erase prohibition voltage Verase_pass is applied to the dummy word lines after a certain time has elapsed since the application of the erase permission voltage, the threshold voltages of the dummy cells may not be further decreased.

After the data in the memory cells has been erased by the erase operation, the erase voltage Verase applied to the common source line CSL is blocked, and the potential of the common source line CSL is discharged.

When the erase voltage Verase having a high voltage level is applied to the common source line CSL during the erase operation, the source select transistor is in a floating state and therefore a Gate Induced Drain Leakage (GIDL) is produced due to a voltage difference from a source-side voltage, and hot holes are generated and flow into the channels, thus increasing the potentials of the channels. Accordingly, the bit line is maintained in a floating state.

Figure 7:
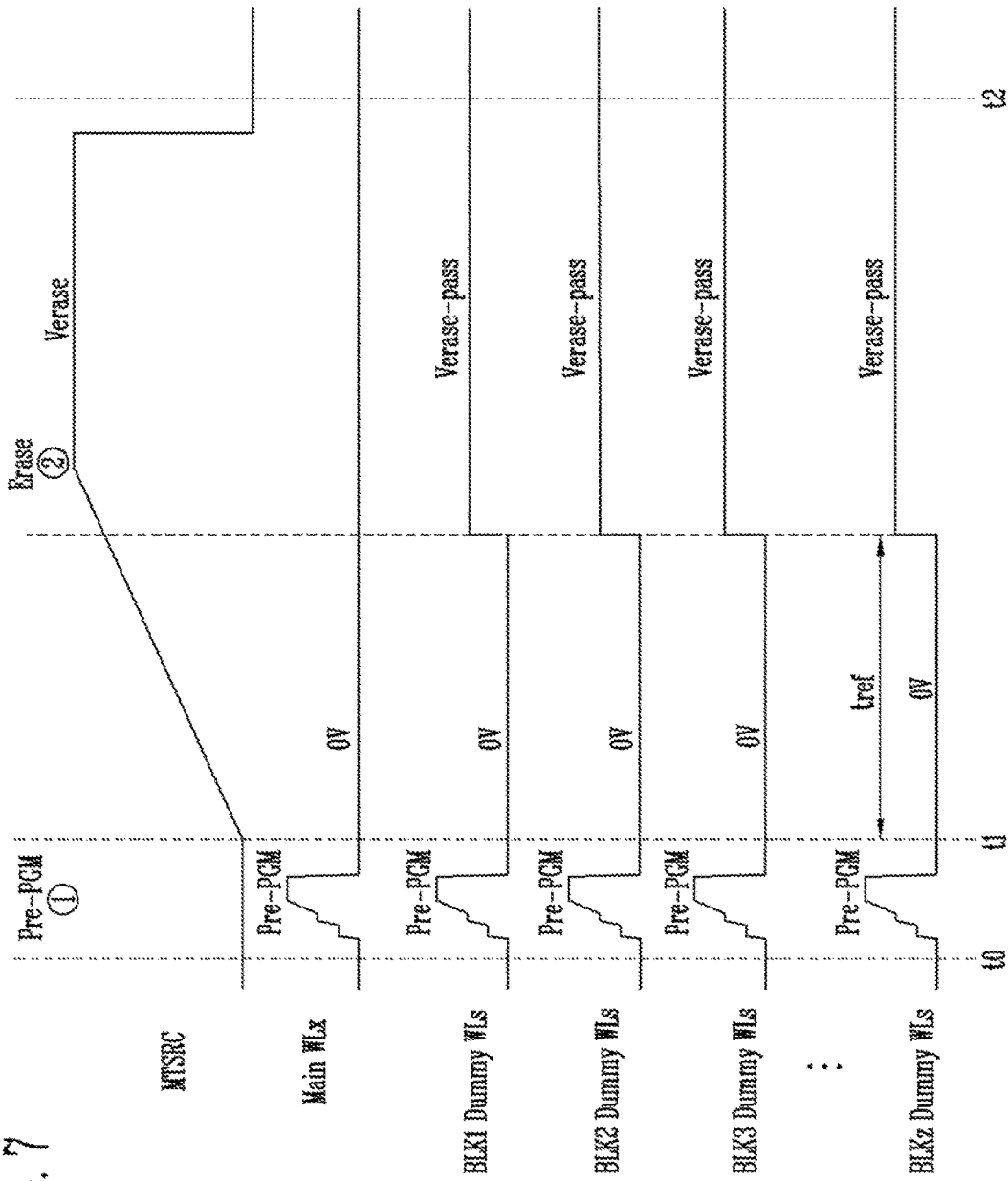
FIG. 7 is a diagram for explaining an example of waveforms of voltages applied to dummy word lines in the erase operation of FIG. 6.

FIG. 7 is a diagram for explaining an example of waveforms of voltages applied to dummy word lines during the erase operation in FIG. 6.

Referring to FIG. 7, the method for operating the semiconductor memory device according to an embodiment of the present disclosure may be divided into a pre-program step ① and an erase step ②.

The pre-program step ① is performed during an interval from t0 to t1, and the erase step ② is performed during an interval from t1 to t2.

During the interval from t0 to t1, a pre-program voltage pulse Pre-PGM may be applied to word lines coupled to a selected memory block. For example, the pre-program voltage pulse Pre-PGM is applied to normal word lines Main WLx to which normal memory cells are coupled, and dummy word lines Dummy WLs to which dummy cells are coupled. In an embodiment, the pre-program voltage pulse Pre-PGM may have a voltage level such that the dummy cells have target threshold voltages after the application of an erase voltage. When the pre-program voltage pulse Pre-PGM is applied, the threshold voltages of the normal memory cells and the dummy cells may be increased.

At time t1, an erase voltage Verase is applied to a node MTSRC coupled to the common source line CSL. With the application of the erase voltage, the voltage of the node MTSRC coupled to the common source line may be increased up to the erase voltage Verase.

At time t1, an erase permission voltage for example, 0 V may be applied both to the normal word lines Main WLx and to the dummy word lines Dummy WLs to which the dummy cells are coupled.

During the interval from t1 to t2, while the voltage of the node MTSRC coupled to the common source line is increased, an erase prohibition voltage Verase_pass may be applied to the dummy word lines.

In accordance with an embodiment of the present disclosure, if the preset time tref has elapsed since the application of the erase voltage to the node MTSRC coupled to the common source line, the semiconductor memory device may apply an erase prohibition voltage to dummy word lines coupled to a plurality of dummy cells included in a selected memory block for example, one of memory blocks BLK1 to BLKz.

When the erase voltage Verase is applied to the node MTSRC coupled to the common source line, the erase permission voltage of 0 V may be applied to the normal word lines Main WLx and the dummy word lines Dummy WLs, to which the dummy cells are coupled, at time t1. After the preset time tref has elapsed, an erase prohibition voltage Verase_pass may be applied to the dummy word lines Dummy WLs.

FIG. 7 illustrates an exemplary case in which the erase prohibition voltage Verase_pass is applied to the dummy cells included in the selected memory block when the preset time tref has elapsed regardless of which of the first to z-th memory blocks BLK1 to BLKz has been selected.

At time t2, the semiconductor memory device may block the erase voltage Verase that is applied to the node MTSRC to which the common source line is coupled, and may discharge the potential of the common source line.

Figure 8:
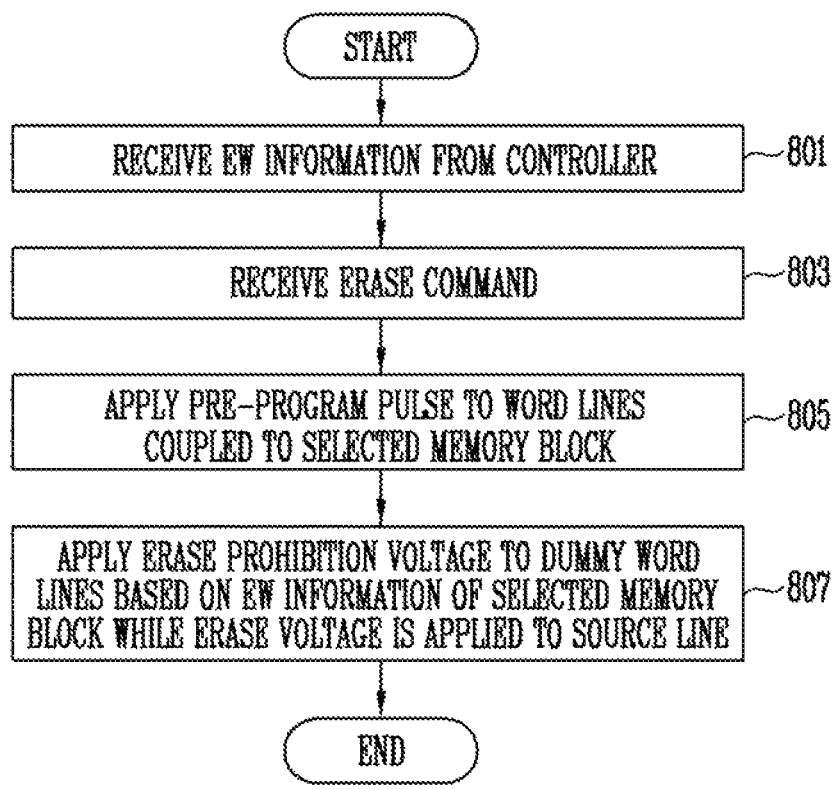
FIG. 8 is a flowchart for explaining an erase operation of a semiconductor memory device according to an embodiment of the present disclosure.

FIG. 8 is a flowchart for explaining an example of an erase operation of a semiconductor memory device according to an embodiment of the present disclosure.

As the number of erase-write cycles of memory cells included in the semiconductor memory device is increased, a program speed or an erase speed may be increased. According to an embodiment of FIG. 8, the semiconductor memory device may determine the time at which an erase prohibition voltage is to be applied to dummy word lines when data in a selected memory block is erased, based on the number of erase-write cycles of the corresponding memory block.

At step 801, the semiconductor memory device may receive Erase-Write (EW) information from a controller. The EW information may be EW cycling information indicating the number of times that data is erased from the memory cells included in the semiconductor memory device and the number of times that data is written to the memory cells that is, the number of erase-write cycles. The number of erase cycles and the number of data write cycles may be obtained from the respective memory blocks.

In an embodiment, the semiconductor memory device may receive the EW cycling information from the controller in response to a set parameter command or a set feature command.

Although steps 801 and 803 to 807 are illustrated as being sequentially performed, steps 801 and 803 to 807 may be independently performed. At step 801, the semiconductor memory device receives the EW information from the controller.

At step 803, the semiconductor memory device may receive an erase command. The semiconductor memory device may receive the address of a memory block to be erased together with the erase command.

At step 805, the semiconductor memory device may perform a pre-program operation to a selected memory block. For this operation, the semiconductor memory device may apply a pre-program pulse to word lines coupled to the selected memory block. In an embodiment, the word lines may include normal word lines and dummy word lines. In an embodiment, the semiconductor memory device may not perform a verify operation during the pre-program operation. In an embodiment, the pre-program pulse applied during the pre-program operation may have a voltage level such that the dummy cells have target threshold voltages after the application of an erase voltage.

At step 807, while the erase voltage is applied to a source line, the semiconductor memory device may apply an erase prohibition voltage to the dummy word lines based on the EW information of the selected memory block. In detail, the semiconductor memory device applies the erase voltage Verase to the common source line CSL. In an embodiment, the semiconductor memory device may apply the erase voltage Verase to a node MTSRC coupled to the common source line CSL. The semiconductor memory device may control a source select transistor SST and a drain select transistor DST so that they are in a floating state. Further, the semiconductor memory device may apply an erase permission voltage for example, a ground voltage to the normal word lines and the dummy word lines which are coupled to the selected memory block. Thereafter, the potential levels of channels are increased depending on the potential level of the common source line CSL. Depending on the potential levels of the channels, the potential levels of source select lines and drain select lines, which are coupled to a plurality of source select transistors and drain select transistors that are in a floating state, may be increased due to a coupling phenomenon.

Pieces of data stored in the memory cells are erased due to the increased potential levels of the channels. That is, electrons stored in the charge storage layers of the memory cells are detrapped by the potentials of the channels due to FN tunneling. This operation will be described below. That is, depending on differences between the increased potential levels of the channels and the potential levels of local word lines having a ground level, the electrons stored in the charge storage layers of the memory cells may be emitted through the channels and detrapped or, alternatively, hot holes generated in the channels may flow into the charge storage layers of the memory cells and then the electrons stored in the charge storage layers are detrapped. The local word lines may be maintained at the ground level or may be changed from the floating state to the ground level.

The semiconductor memory device may control a degree at which the dummy memory cells are erased while the erase voltage Verase is applied to the common source line CSL. For example, if the preset time has elapsed while the voltage of the common source line CSL is increased, the semiconductor memory device may apply an erase prohibition voltage Verase_pass to the dummy word lines. That is, if the erase prohibition voltage Verase_pass is applied to the dummy word lines after a certain time has elapsed since the application of the erase permission voltage, the threshold voltages of the dummy cells may not be further decreased.

In an embodiment, the semiconductor memory device may determine the time at which the erase prohibition voltage Verase_pass is applied to dummy word lines to which dummy cells included in the selected memory block are coupled, based on the EW information of the selected memory block.

The semiconductor memory device may apply the erase prohibition voltage Verase_pass to the dummy word lines at the determined time.

After the data in the memory cells has been erased by the erase operation, the erase voltage Verase applied to the common source line CSL is blocked, and the potential of the common source line CSL is discharged.

When the erase voltage Verase having a high voltage level is applied to the common source line CSL during the erase operation, the source select transistor is in a floating state and therefore a Gate Induced Drain Leakage (GIDL) is produced due to a voltage difference from a source-side voltage, and hot holes are generated and flow into the channels, thus increasing the potentials of the channels. At this time, the bit line is maintained in a floating state.

Figure 9:
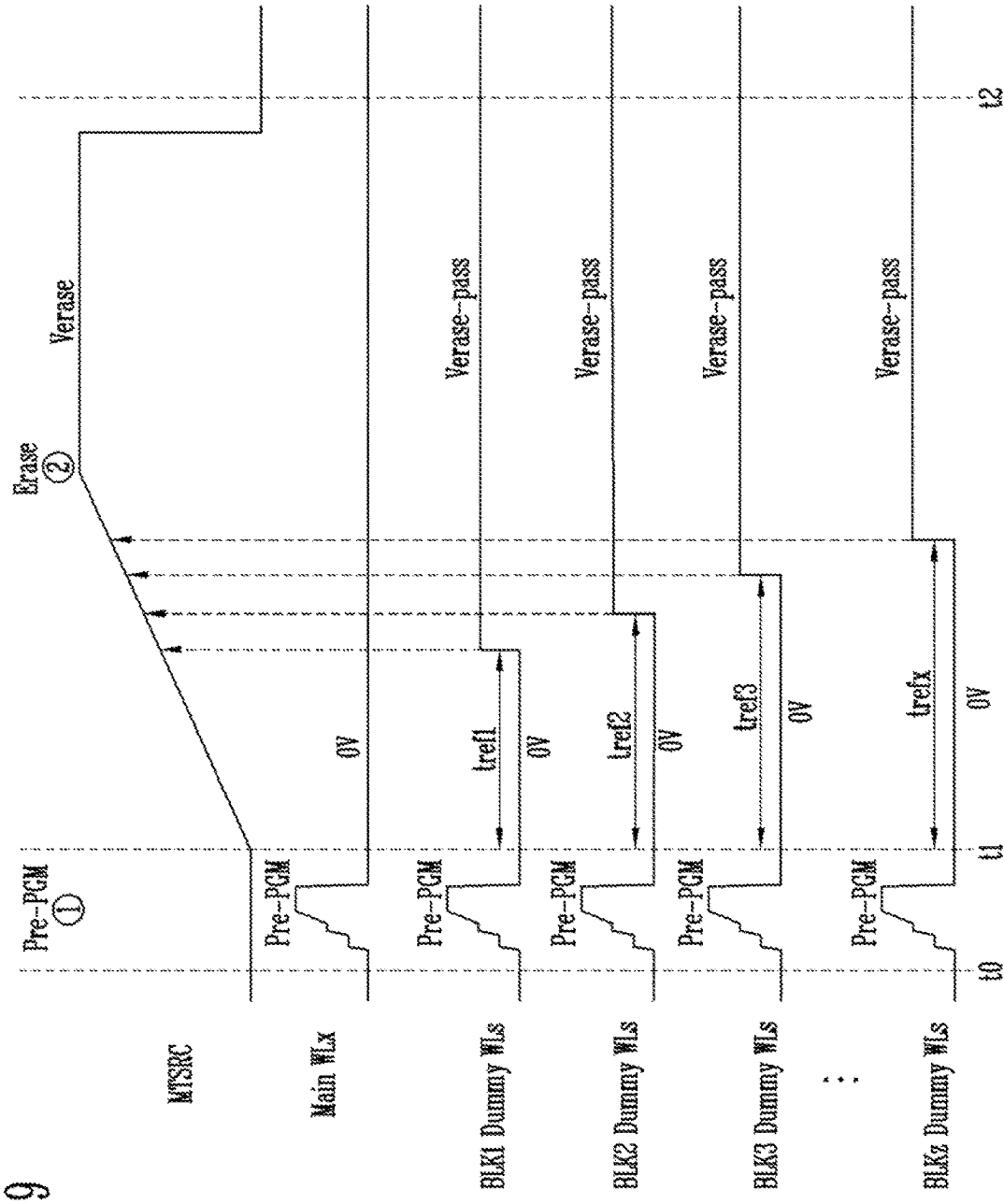
FIG. 9 is a diagram for explaining an example of waveforms of voltages applied to dummy word lines in the erase operation of FIG. 8.

FIG. 9 is a diagram for explaining an example of waveforms of voltages applied to dummy word lines during the erase operation of FIG. 8.

Referring to FIG. 9, the method for operating the semiconductor memory device according to an embodiment of the present disclosure may be divided into a pre-program step ① and an erase step ②.

Hereinafter, a description will be made in which the number of erase-write cycles of a first memory block BLK1 is greater than the number of erase-write cycles of a second memory block BLK2, the number of erase-write cycles of the second memory block BLK2 is greater than the number of erase-write cycles of a third memory block BLK3, and the number of erase-write cycles of a z–1-th memory block BLKz-1 is greater than the number of erase-write cycles of a z-th memory block BLKz.

The pre-program step ① is performed during an interval from t0 to t1, and the erase step ② is performed during an interval from t1 to t2.

During the interval from t0 to t1, a pre-program voltage pulse Pre-PGM may be applied to word lines coupled to a selected memory block. For example, the pre-program voltage pulse Pre-PGM is applied to normal word lines Main WLx to which normal memory cells are coupled, and dummy word lines Dummy WLs to which dummy cells are coupled. In an embodiment, the pre-program voltage pulse Pre-PGM may have a voltage level such that the dummy cells have target threshold voltages after the application of an erase voltage. When the pre-program voltage pulse Pre-PGM is applied, the threshold voltages of the normal memory cells and the dummy cells may be increased.

At time t1, an erase voltage Verase is applied to a node MTSRC coupled to the common source line CSL. With the application of the erase voltage, the voltage of the node MTSRC coupled to the common source line may be increased up to the erase voltage Verase.

At time t1, an erase permission voltage for example, 0 V may be applied both to the normal word lines Main WLx and to the dummy word lines Dummy WLs to which the dummy cells are coupled.

During the interval from t1 to t2, while the voltage of the node MTSRC coupled to the common source line is increased, an erase prohibition voltage Verase_pass may be applied to the dummy word lines.

The program speeds of dummy cells may differ depending on the number of erase-write cycles of a memory block which is to be erased. For example, the program speed of dummy cells included in a memory block in which the number of erase-write cycles is relatively large may be greater than the program speed of dummy cells included in a memory block in which the number of erase-write cycles is relatively small. To compensate for a difference between the program speeds of the dummy cells depending on the number of erase-write cycles, in accordance with the embodiments of FIGS. 8 and 9, the semiconductor memory device may control the times at which the erase prohibition voltage Verase_pass is applied to the dummy word lines to be different from each other based on the EW cycling information of the selected memory block.

When the selected memory block is the first memory block BLK1 in which the number of erase-write cycles is the largest, the semiconductor memory device may apply the erase prohibition voltage Verase_pass to the dummy word lines Dummy WLs of the first memory block BLK1 if a shortest first preset time tref1 has elapsed since the application of the erase permission voltage (0 V) to the dummy word lines.

When the selected memory block is the second memory block BLK2 in which the number of erase-write cycles is the second-largest, the semiconductor memory device may apply the erase prohibition voltage Verase_pass to the dummy word lines Dummy WLs of the second memory block BLK2 if a second-shortest second reference time tref2 has elapsed since the application of the erase permission voltage (0 V) to the dummy word lines.

That is, the semiconductor memory device may determine the times at which the erase prohibition voltage Verase_pass is to be applied to the dummy word lines based on the number of erase-write cycles of the selected memory block. The erase prohibition voltage Verase_pass may be applied to the dummy cells included in a memory block, in which the number of erase-write cycles is larger, prior to being applied to the dummy cells in a memory block in which the number of erase-write cycles is smaller.

At time t2, the semiconductor memory device may block the erase voltage Verase that is applied to the node MTSRC to which the common source line is coupled, and may discharge the potential of the common source line.

In accordance with the present disclosure, the semiconductor memory device may perform a pre-program operation before applying an erase voltage and may apply an erase prohibition voltage to dummy word lines while the application of the erase voltage, without executing a soft program on the dummy cells, which was performed after applying the erase voltage in conventional technology, thus enabling the threshold voltages of dummy cells to be controlled.

Further, to reflect different EW cycling information of the respective memory blocks, the times at which the erase prohibition voltage Verase_pass is to be applied may be determined based on the EW cycling information, and the erase prohibition voltage may be respectively applied to the dummy word lines at the determined times, thus enabling the threshold voltages of the dummy cells to be precisely controlled.

Figure 10:
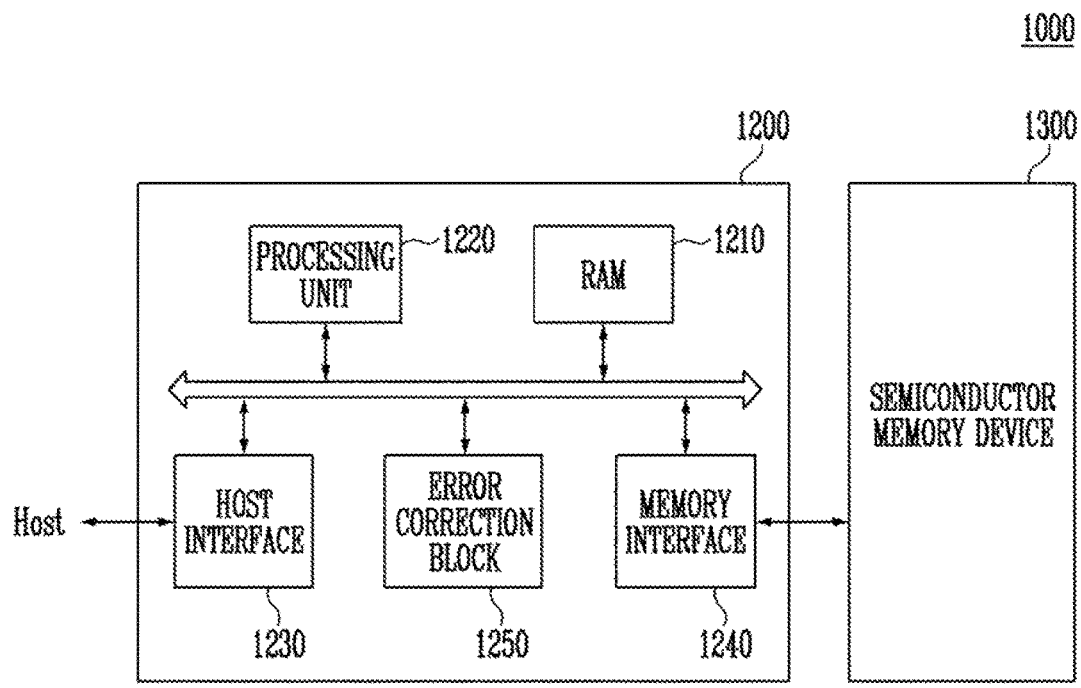
FIG. 10 is a diagram illustrating a memory system including the semiconductor memory device of FIG. 2.

FIG. 10 is a block diagram illustrating a memory system 1000 including a semiconductor memory device of FIG. 2.

Referring to FIG. 10, the memory system 1000 may include a semiconductor memory device 1300 and a controller 1200.

The semiconductor memory device 1300 may have the same configuration and operation as the semiconductor memory device 100 described above with reference to FIG. 2. Hereinafter, repetitive descriptions will be omitted.

The controller 1200 is coupled to a host Host and the semiconductor memory device 1300. The controller 1200 is configured to access the semiconductor memory device 1300 in response to a request from the host Host. For example, the controller 1200 is configured to control read, write, erase, and background operations of the semiconductor memory device 1300. The controller 1200 is configured to provide an interface between the host Host and the semiconductor memory device 1300. The controller 1200 is configured to run firmware for controlling the semiconductor memory device 1300.

The controller 1200 includes a RAM (Random Access Memory) 1210, a processing unit 1220, a host interface 1230, a memory interface 1240, and an error correction block 1250.

The RAM 1210 is used as any one of a work memory of the processing unit 1220, a cache memory between the semiconductor memory device 1300 and the host Host, and a buffer memory between the semiconductor memory device 1300 and the host Host.

The processing unit 1220 controls the overall operation of the controller 1200. The processing unit 1220 is configured to control a read operation, a program operation, an erase operation and a background operation of the semiconductor memory device 1300. The memory control unit 1220 is configured to run firmware for controlling the semiconductor memory device 1300. The processing unit 1220 may perform a function of a Flash Translation Layer (FTL). The processing unit 1220 may translate a logical block address (LBA), provided by the host, into a physical block address (PBA) through the FTL. The FTL may receive the LBA using a mapping table and may translate the LBA into the PBA. Address mapping methods performed through the FTL include various methods according to a mapping unit. Representative address mapping methods include a page mapping method, a block mapping method, and a hybrid mapping method.

The processing unit 1220 is configured to randomize data provided from the host Host. For example, the processing unit 1220 may randomize the data provided from the host Host using a randomizing seed. The randomized data is provided, as data to be stored, to the semiconductor memory device 1300 and is then programmed in the memory cell array.

The processing unit 1220 is configured to derandomize the data provided from the semiconductor memory device 1300 during a read operation. For example, the processing unit 1220 may derandomize the data provided from the semiconductor memory device 1300 using a derandomizing seed. The derandomized data may be outputted to the host Host.

In an embodiment, the processing unit 1220 may perform randomize and derandomize operations by running software or firmware.

The host interface 1230 includes a protocol for performing data exchange between the host Host and the controller 1200. In an example of an embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1240 interfaces with the semiconductor memory device 1300. For example, the memory interface 1240 includes a NAND interface or NOR interface.

The error correction block 1250 is configured to use an error correcting code (ECC) to detect and correct an error in data provided from the semiconductor memory device 1300. The error correction block 1250 may correct errors from read page data using an ECC. The error correction block 1250 may correct errors using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or hamming code.

During a read operation, the error correction block 1250 may correct errors from read page data. When a number of error bits exceeding the number of correctable bits are included in the read page data, decoding may fail. When a number of error bits less than or equal to the number of correctable bits are included in the page data, decoding may succeed. A success in decoding indicates that the corresponding read command has passed. A failure in decoding indicates that the corresponding read command has failed. When decoding succeeds, the controller 1200 outputs error-corrected page data to the host.

The controller 1200 and the semiconductor memory device 1300 may be integrated into a single semiconductor device. In an example of an embodiment, the controller 1200 and the semiconductor memory device 1300 may be integrated into a single semiconductor device to form a memory card. For example, the controller 1200 and the semiconductor memory device 1300 may be integrated into a single semiconductor device and form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The controller 1200 and the semiconductor memory device 1300 may be integrated into a single semiconductor device to form a solid state drive (SSD). The SSD includes a storage device configured to store data in a semiconductor memory. When the memory system is used as the SSD, an operation speed of the host Host coupled to the memory system may be phenomenally improved.

In an embodiment, the memory system may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an example of an embodiment, the semiconductor memory device 1300 or the memory system may be embedded in various types of packages. For example, the semiconductor memory device 1300 or the memory system may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi-Chip Package (MCP), Wafer-level Fabricated Package (WFP), Wafer-Level Processed Stack Package (WSP), or the like.

Figure 11:
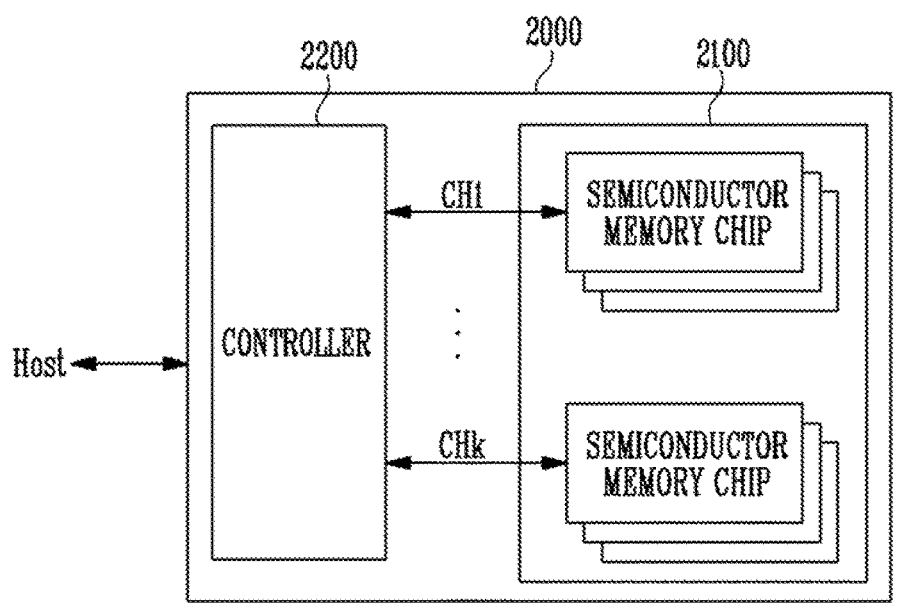
FIG. 11 is a diagram illustrating an example of application of the memory system of FIG. 10.

FIG. 11 is a block diagram illustrating an example 2000 of application of the memory system of FIG. 10.

Referring to FIG. 11, the memory system 2000 includes a semiconductor memory device 2100 and a controller 2200. The semiconductor memory device 2100 includes a plurality of semiconductor memory chips. The semiconductor memory chips are divided into a plurality of groups.

Referring to FIG. 11, it is illustrated that each of the plurality of groups communicates with the controller 2200 through first to k-th channels CH1 to CHk. Each semiconductor memory chip may have the same configuration and operation as those of an embodiment of the semiconductor memory device 1300 described with reference to FIG. 10.

Each group communicates with the controller 2200 through one common channel. The controller 2200 has the same configuration as that of the controller 1200 described with reference to FIG. 10 and is configured to control the plurality of memory chips of the semiconductor memory device 2100 through the plurality of channels CH1 to CHk.

Referring to FIG. 11, a description has been made such that a plurality of semiconductor memory chips are coupled to a single channel. However, it will be understood that the memory system 2000 may be modified such that a single semiconductor memory chip is coupled to a single channel.

Figure 12:
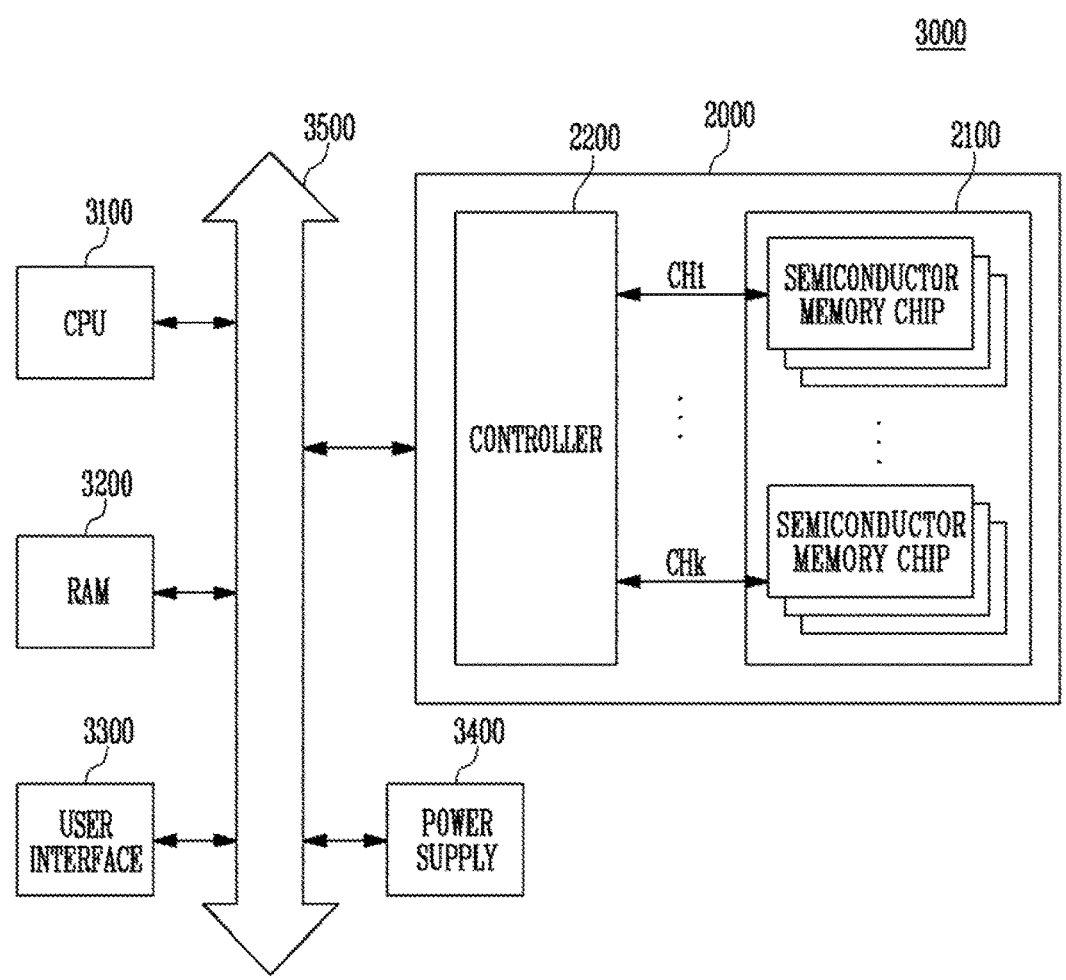
FIG. 12 is a diagram illustrating a computing system including the memory system described with reference to FIG. 11.

FIG. 12 is a block diagram illustrating a computing system including the memory system described with reference to FIG. 11.

Referring to FIG. 12, a computing system 3000 may include a central processing unit (CPU) 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

Referring to FIG. 12, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

Referring to FIG. 12, the memory system 2000 described with reference to FIG. 11 is illustrated as being provided. However, the memory system 2000 may be replaced with the memory system 1000 described with reference to FIG. 10. In an embodiment, the computing system 3000 may be configured to include all of the memory systems 1000 and 2000 described with reference to FIGS. 10 and 11.

In accordance with embodiments of the present disclosure, there are provided a semiconductor memory device having improved reliability, and a method for operating the semiconductor memory device.

Examples of embodiments have been disclosed herein, and although specific terms are employed, the terms are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device, comprising:
a memory cell array including a plurality of memory blocks, each including dummy cells coupled to dummy word lines and normal memory cells coupled to normal word lines;
a peripheral circuit configured to perform an erase operation on a memory block selected from among the plurality of memory blocks; and
a control logic configured to control the peripheral circuit, during the erase operation, to apply an erase permission voltage to the dummy word lines and the normal word lines for a preset time and to apply an erase prohibition voltage to the dummy word lines after the preset time,
wherein the preset time is determined based on Erase-Write (EW) cycling information and is determined regardless of a time for the erase operation, and
wherein the EW cycling information indicates a number of erase-write cycles of the selected memory block.

2. The semiconductor memory device according to claim 1,
wherein the control logic applies the erase permission voltage to the dummy word lines and the normal word lines while applying an erase voltage to a common source line, and applies a pre-program voltage pulse to the dummy word lines and the normal word lines before the erase permission voltage is applied to the dummy word lines and the normal word lines.

3. The semiconductor memory device according to claim 2, wherein the erase permission voltage is a ground voltage.

4. The semiconductor memory device according to claim 2, wherein the control logic includes an erase operation control unit configured to store the EW cycling information for each of the plurality of memory blocks.

5. The semiconductor memory device according to claim 2, wherein a length of the preset time becomes shorter as the number of erase-write cycles of the selected memory block becomes greater.

6. The semiconductor memory device according to claim 1, wherein the control logic receives respective pieces of the EW cycling information for each of the plurality of memory blocks from an external controller either periodically or randomly.

7. The semiconductor memory device according to claim 6, wherein the control logic receives the EW cycling information from the external controller in response to a set parameter command.

8. The semiconductor memory device according to claim 6, wherein the control logic receives the EW cycling information from the external controller in response to a set feature command.

9. A method for operating a semiconductor memory device, the semiconductor memory device including a plurality of memory blocks, each including dummy cells coupled to dummy word lines and normal memory cells coupled to normal word lines, the method comprising:
  applying a pre-program voltage pulse to dummy word lines and to normal word lines that are coupled to a memory block selected from among the plurality of memory blocks;
  applying an erase permission voltage to the dummy word lines and the normal word lines for a preset time; and
  applying an erase prohibition voltage to the dummy word lines after the preset time,
  wherein the preset time is determined based on Erase-Write (EW) cycling information, and is determined regardless of a time for an erase operation, and
  wherein the EW cycling information indicates a number of erase-write cycles of the selected memory block.

10. The method according to claim 9, wherein applying the erase permission voltage comprises:
  applying the erase permission voltage to the dummy word lines and the normal word lines while applying an erase voltage to a common source line.

11. The method according to claim 10, wherein applying the erase permission voltage includes applying a ground voltage to the dummy word lines and the normal word lines.

12. The method according to claim 10, wherein a length of the preset time becomes shorter as the number of erase-write cycles of the selected memory block becomes greater.

13. The method according to claim 9, further comprising receiving respective pieces of the EW cycling information for each of the plurality of memory blocks from an external controller either periodically or randomly.

14. The method according to claim 13, wherein receiving the respective pieces of the EW cycling information is performed in response to a set parameter command.

15. The method according to claim 13, wherein receiving the respective pieces of the EW cycling information is performed in response to a set feature command.

* * * * *